(12) United States Patent
Bergum et al.

(10) Patent No.: US 8,917,497 B2
(45) Date of Patent: Dec. 23, 2014

(54) JOBSITE STORAGE CABINET FOR HOUSING ELECTRONIC EQUIPMENT

(75) Inventors: Robert A. Bergum, Woodstock, IL (US); Gary Peterson, Hawthorn Woods, IL (US)

(73) Assignee: Knaack LLC, Crystal Lake, IL (US)

( * ) Notice: Subject to any disclaimer, the term of this patent is extended or adjusted under 35 U.S.C. 154(b) by 268 days.

(21) Appl. No.: 13/555,834

(22) Filed: Jul. 23, 2012

(65) Prior Publication Data

US 2014/0021837 A1 Jan. 23, 2014

(51) Int. Cl.
*G06F 1/16* (2006.01)

(52) U.S. Cl.
USPC ......... 361/679.02; 312/322; 174/51; 439/629

(58) Field of Classification Search
USPC .................. 361/679.58, 692, 679.31, 679.47, 361/679.4, 752, 679.03, 679.26, 679.29, 361/679.3, 679.02, 679.28, 679.45, 679.27, 361/679.43, 679.33; 312/201, 223.1, 223.6, 312/194, 322, 223.2, 209, 237, 215, 221, 312/270.3; 345/440, 1–3, 1.1, 685, 905, 345/158, 173, 163, 156, 157; 455/418, 455/404.1, 414.1, 3.06, 575.1, 300, 11.1, 455/421, 556.1, 569.1; 439/79, 487, 626, 439/108, 607.2, 629, 607.1, 639, 638, 439/607.55, 541.5, 532
See application file for complete search history.

(56) References Cited

U.S. PATENT DOCUMENTS

| | | | |
|---|---|---|---|
| 6,513,342 B1 | 2/2003 | Flynn | |
| 6,532,152 B1 * | 3/2003 | White et al. | 361/692 |
| 6,548,753 B1 | 4/2003 | Blackmon et al. | |
| 6,877,270 B2 * | 4/2005 | Nelson et al. | 43/58 |
| 7,769,486 B2 * | 8/2010 | McHenry et al. | 700/241 |
| 8,329,163 B2 * | 12/2012 | Crooke et al. | 424/93.2 |
| 2005/0231079 A1 * | 10/2005 | Rockcastle | 312/201 |
| 2006/0021776 A1 * | 2/2006 | Newman | 174/51 |
| 2007/0095774 A1 | 5/2007 | Canfield et al. | |
| 2011/0051363 A1 * | 3/2011 | Chen et al. | 361/679.58 |

OTHER PUBLICATIONS

Extended European Search Report for App. No. 13177647.8, dated Apr. 16, 2014.
Air Coolers [online]. TE Technology, Inc., 2010 [retrieved on Jun. 26, 2012]. Retrieved from the Internet: <URL: www.tetech.com/Air-Coolers.html>.
Bulding Information Modeling [online]. Wikipedia [retrieved on Jun. 26, 2012]. Retrieved from the Internet: <URL: www.en.wikipedia.org/wiki/Building_Information_Modeling>.
Static Strap [online]. Napa Auto Parts [retrieved on Jun. 26, 2012]. Retrieved from the Internet: <URL: www.napaonline.com/Catalog/CatalogItemDetail.aspx?R=NBHS206_0376424257>.
Integrated Project Delivery [online]. Wikipedia [retrieved on Jun. 26, 2012]. Retrieved from the Internet: <URL: www.en.wikipedia.org/wiki/INtegrated_project_delivery>.

* cited by examiner

*Primary Examiner* — Hung Duong
(74) *Attorney, Agent, or Firm* — McDonnell Boehnen Hulbert & Berghoff LLP

(57) ABSTRACT

A storage cabinet configured to accommodate electronic equipment is disclosed. The storage cabinet has front, rear, and side walls extending upwardly from a bottom to define a storage space. The storage cabinet also includes a compartment located within the storage space configured to accommodate electronic equipment. The compartment includes an electronic cooling device for each piece of equipment, a ventilation system, and one or more components for receiving and transmitting wireless signals into and out of the cabinet.

22 Claims, 5 Drawing Sheets

JOBSITE STORAGE CABINET FOR HOUSING ELECTRONIC EQUIPMENT

FIELD OF THE INVENTION

This invention relates to the field of storage cabinets for construction sites. More particularly, the invention relates to storage cabinets configured to accommodate electronic equipment in order to facilitate contractor participation in Building Information Modeling.

BACKGROUND

The building industry is changing with the application of Building Information Modeling ("BIM"). BIM is a building development tool that utilizes multi-dimensional modeling concepts, information technology and software interoperability to design, construct and manage a building project. Professionals from each phase of a building project, from the architects, surveyors, civil engineers, contractors and subcontractors to the ultimate owner and operator, all input discipline-specific knowledge into a single information model. The use of such a model prevents the loss of information that traditionally takes place as a building project moves from one stage to the next.

To facilitate the participation of contractors and subcontractors in the BIM process, it would be useful to provide electronic equipment at the construction site so as to readily input information into a BIM model or access information previously entered into the model. As can be appreciated, a typical construction site does not lend itself to the use of laptops for entry of data into an information model nor does it provide a convenient location from which to examine previously entered information such as, for example, building schematics on a flat panel screen.

Further, it would be advantageous to provide such electronic equipment at the jobsite in a manner that it can be transported safely and also be able to withstand the rough environment of the construction site. A number of containers, such as tool boxes and storage cabinets, are currently used at construction jobsites for safely storing tools and materials that contractors utilize to complete their work. These jobsite storage containers are constructed so that they are able to withstand the rugged conditions of the construction site. The currently available jobsite storage containers, however, are not configured in a manner to house electronic equipment.

Thus, there is a need for providing access to electronic equipment at the construction site in order to enable participation in the BIM process, while ensuring the equipment is safely secured and protected from the harsh elements of the construction site.

These as well as other aspects and advantages will become apparent to those of ordinary skill in the art by reading the following detailed description, with reference where appropriate to the accompanying drawings. Further, it should be understood that the embodiments described in this summary and elsewhere are intended to illustrate the invention by way of example only.

SUMMARY

In one embodiment, the present application provides a storage cabinet comprising front, rear, and side walls extending upwardly from a bottom to define a storage space. The storage cabinet also includes a compartment located within the storage space configured to accommodate electronic equipment. The compartment includes a ventilation system, one or more components for receiving and transmitting wireless signals into and out of the cabinet, and an electronic cooling device for each piece of equipment.

In yet another embodiment, a storage cabinet configured to accommodate electronic equipment is disclosed. The storage cabinet has a lower compartment and an upper compartment, each configured to accommodate the electronic equipment. The storage cabinet also includes a ventilation system for ventilating the cabinet, one or more components for receiving and transmitting wireless signals into and out of the cabinet, and a cooling device for each piece of equipment.

BRIEF DESCRIPTION OF THE FIGURES

Exemplary embodiments of the invention are described herein with reference to the drawings, in which.

DETAILED DESCRIPTION

The present invention is directed to a jobsite storage cabinet that is configured to accommodate electronic components while ensuring that the electronic components are safely secured and protected from the harsh elements of the construction site. With the present invention, electronic components can be located at the construction site, thereby enabling contractors to participate in the BIM process.

Figure 1:
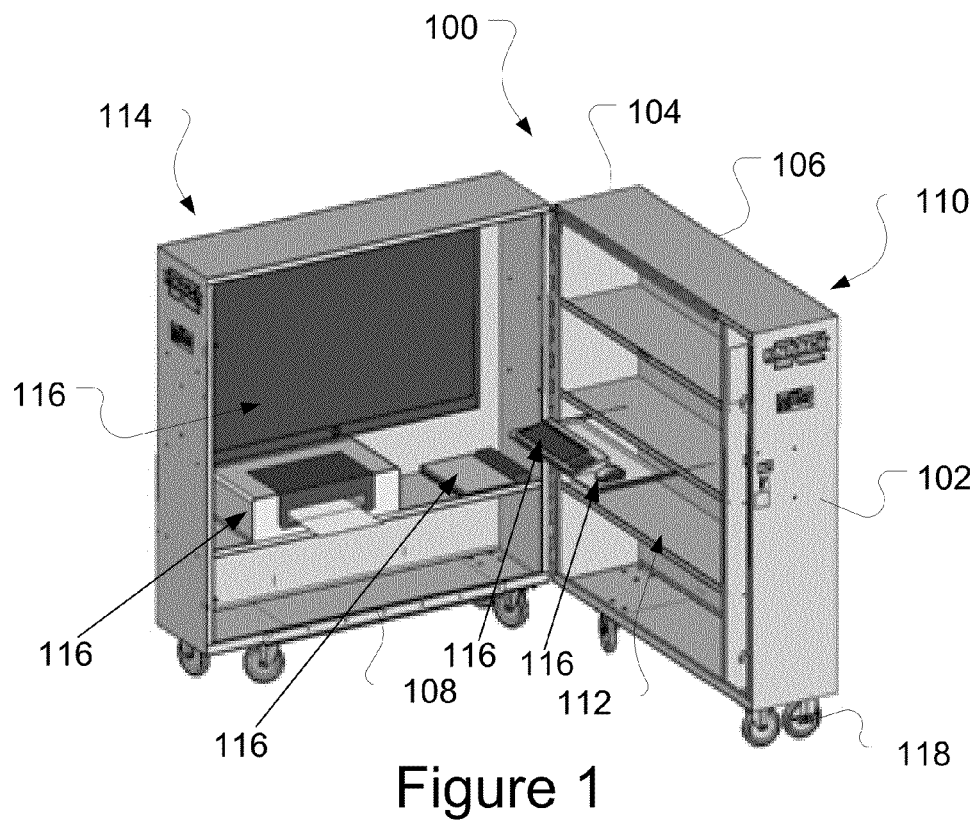
FIG. 1 is a perspective view of an embodiment of the present invention.

Turning now to the figures, a vertical storage cabinet 100 made in accordance with the present invention is shown in FIG. 1. The cabinet 100 has front 102, rear 104, and side walls 106 extending upwardly from a bottom wall 108 to define a storage space. The cabinet 100 has two vertical sections, a first section 110 including shelving for storing tools and supplies, and a second section 114 configured for accommodating a number of electronic components 116, including a flat screen, a printer, and a computer or laptop. As can be seen in FIG. 1, a flat screen may be mounted on a wall of the cabinet 100, with the printer and the computer or laptop placed on a shelf extending between the front and rear walls. It should be understood that the first section 110 may also be configured to accommodate a number of electronic components such as, for example, a keyboard and a mouse. The location of each component in the cabinet 100 may vary depending upon the needs of the contractor. The cabinet 100 may also be provided with a number of castors 118 adjacent the bottom wall 108 to allow the cabinet to be moved from one location to another location.

Figure 2:
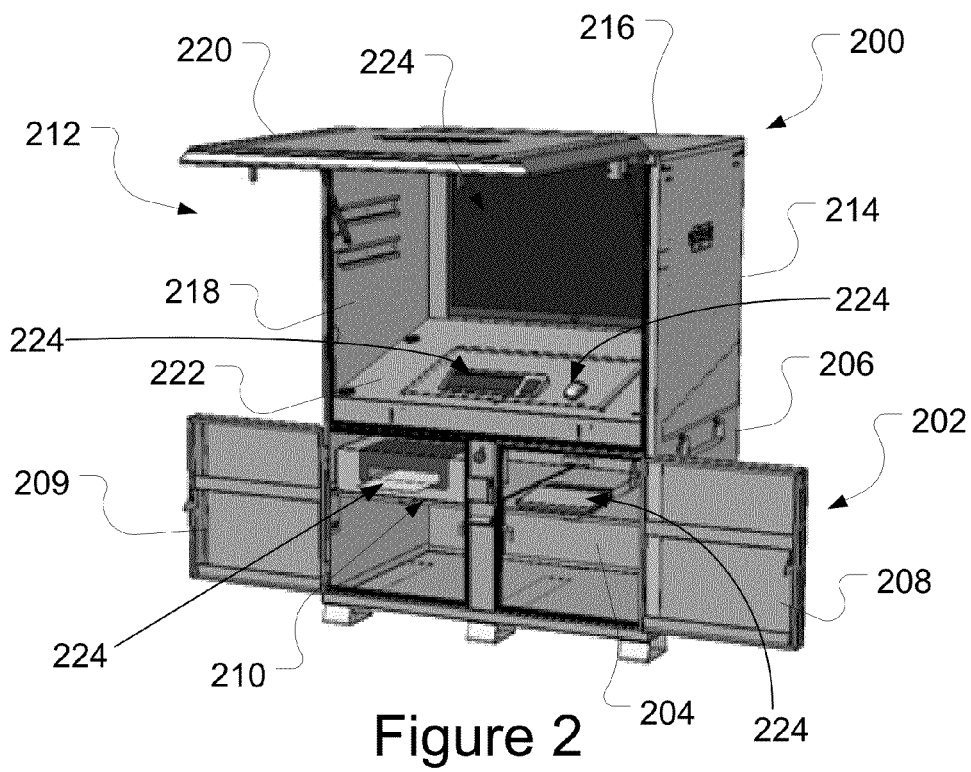
FIG. 2 is a perspective view of another embodiment of the present invention.

Another storage cabinet 200 made in accordance with the present invention is shown in FIG. 2. The storage cabinet 200 is provided with a lower portion 202 comprising a compartment having a back wall 204, side walls 206, two front doors 208, 209, and at least one shelving unit 210 extending between the side walls 206. The cabinet 200 further includes an upper portion 212 comprising a compartment including a back wall 214, a top wall 216, side walls 218, a front door 220 mounted via a hinge to the top wall 216, and an inclined surface 222. The upper portion 212 is configured to accommodate electronic equipment 224 such as a flat screen or touch screen, a keyboard and a mouse. A flat screen or touch screen may be mounted on the back wall 214. The inclined surface 222 serves as a work surface upon which to place electronic components such as a keyboard and mouse. The lower portion 202 of the cabinet 200 can accommodate additional electronic components such as a computer or laptop and a printer. Again the location of each component in the cabinet may vary depending upon the needs of the contractor.

Figure 3:
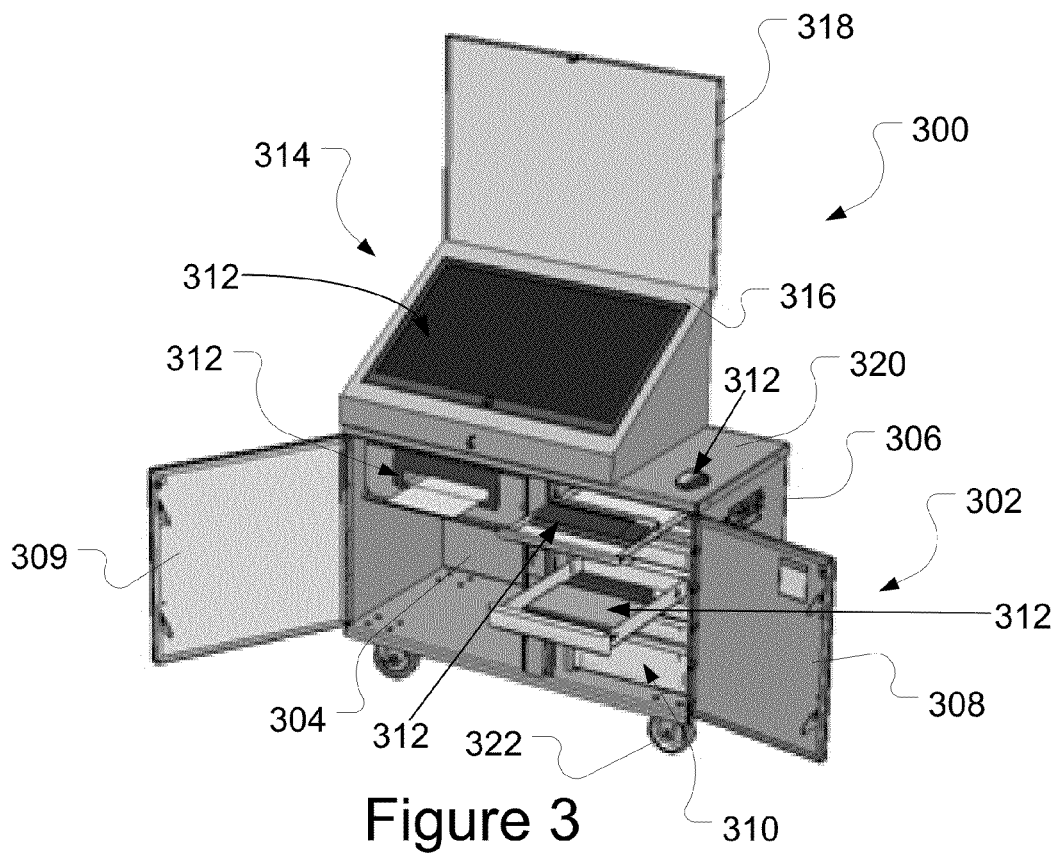
FIG. 3 is a perspective view of yet another embodiment of the present invention.

FIG. 3 depicts another storage cabinet 300 made in accordance with the present invention. The storage cabinet 300 has a lower portion 302 comprising a compartment having a back wall 304, side walls 306, two front doors 308, 309, and at least one shelving unit 310 extending between the side walls 306, the lower portion configured to accommodate a number of electronic components 312 such a computer or laptop, a printer, and a keyboard. The cabinet 300 further includes an upper portion 314 comprising an enclosure for housing a flat screen or touch screen. As can be seen, the screen is situated along an inclined surface 316 to facilitate viewing. The upper portion 314 further has a cover 318 for providing protection for the screen. The cabinet 300 also provides a work area 320 adjacent the upper portion 314 upon which equipment may be placed. As with the storage cabinet of FIG. 1, the storage cabinet of FIG. 3 includes castors 322 for mobility.

Figure 4:
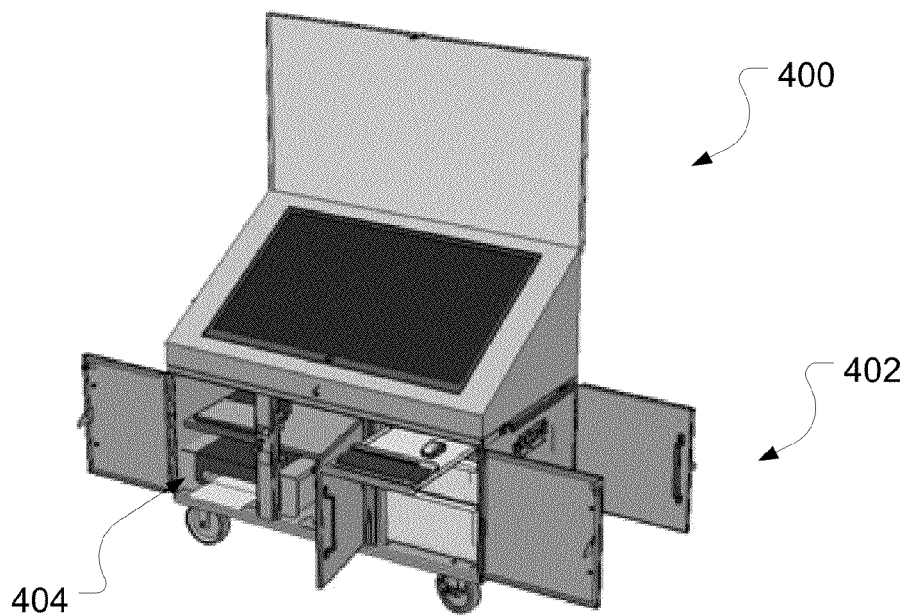
FIG. 4 is a perspective view of another embodiment of the present invention.

FIG. 4 depicts yet another storage cabinet 400 made in accordance with the present invention. The storage cabinet 400 is similar to that depicted in FIG. 3, except that it has an additional storage unit 404 in the lower portion 402.

Power is provided to the electronic components housed in the storage cabinets 100-400 through a power supply such as a fused panel mounted power supply (not shown). The power supply may include a surge protector to stabilize any inconsistency in the supply of electricity that may occur at a construction jobsite.

In order to secure the contents from theft, the cabinets 100-400 depicted in FIGS. 1-4 may be provided with a locking mechanism such as Knaack LLC's WATCHMAN® IV lock system, which is the subject of U.S. Pat. No. 6,772,613, the disclosure of which is hereby incorporated by reference. Further, the cabinets 100-400 are constructed of high gauge steel in order to protect the contents from the elements.

The storage cabinets 100-400 may be configured to house a number of different electronic components including, but not limited to, a TV screen, a touch screen, a laptop docking station, a computer or laptop, a printer, a wireless keyboard, and a wireless mouse. The number and type of components will depend upon the specific construction site and the needs of the contractor.

Figure 5:
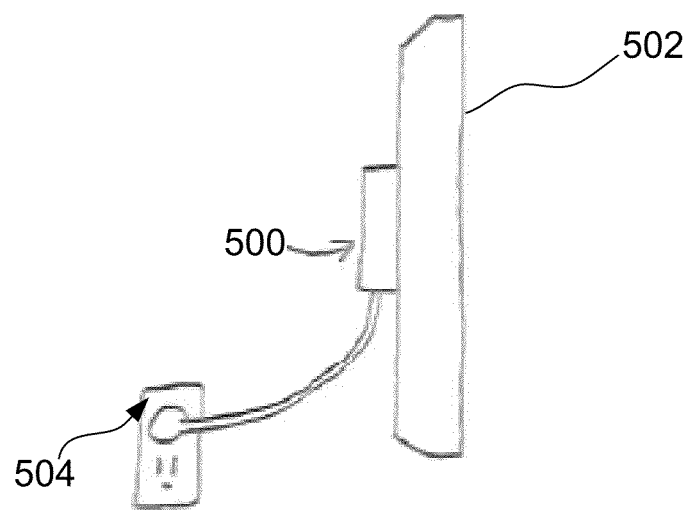
FIG. 5 depicts a cooling device that may be used in the present invention.

With a number of electronic components housed within a storage cabinet, the heat generated by the components needs to be dissipated by some manner so as to keep the components cool and functioning properly. The dissipation of heat is especially important in instances in which the electronics are housed in small enclosures from which heat cannot escape. The present invention overcomes this issue by providing a cooling device mounted on each electronic component. As seen in FIG. 5, an exemplary cooling device 500 is mounted on an electronic component 502 and connected to a power supply 504. Each cooling device 500 functions to keep its respective component cool during operation, and may take the form of an electronic cooling device, such as a thermoelectric cooler or a cooling fan, which are both commercially available. For example, TE Technology, Inc. provides a number of suitable air coolers or air-to-air heat exchangers. Such cooling devices may be provided on any of the embodiments shown in FIGS. 1-4. In other examples, alternate cooling devices may be used.

Figure 6:
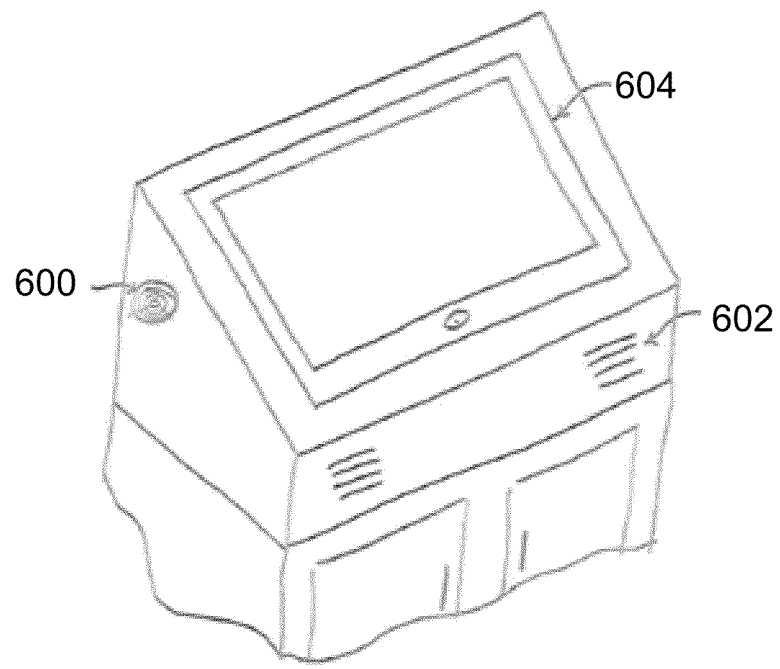
FIG. 6 depicts a ventilation system that may be used in the present invention.
Figure 7:
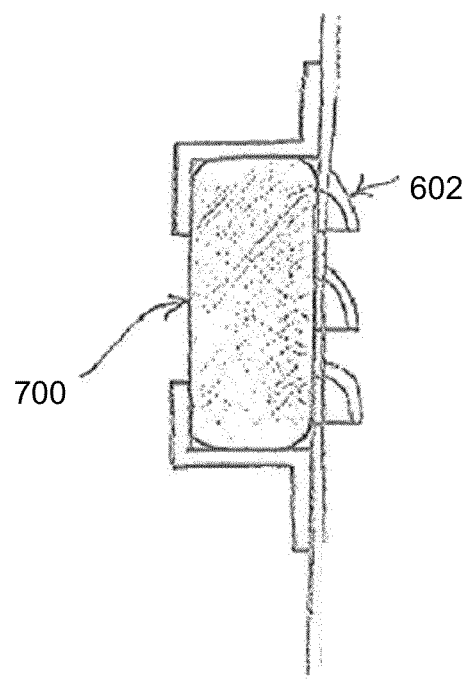
FIG. 7 is a cross-sectional view of the louvered vent of FIG. 6.

As another means to cool the electronic components, the present invention provides a ventilation system for ventilating the cabinet. As depicted in FIG. 6, the present invention may be provided with a cooling fan 600 and/or a number of vent louvers 602 to provide the needed ventilation for electronic component 604. The louvered vents 602 may include a foam filter 700, as shown in FIG. 7, for filtering dust and debris, and preventing the entry of insects into the cabinet interior. Such a ventilation system may be provided on any of the embodiments shown in FIGS. 1-4. In other examples, alternate ventilation systems may be used.

Figure 8:
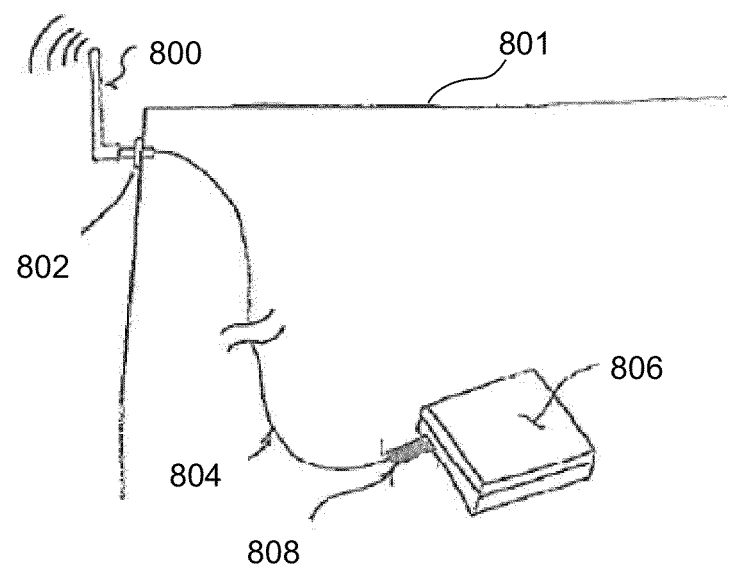
FIG. 8 is a schematic of the manner by which a wireless internet signal is provided to a computer contained in the present invention.

In order to ensure that a wireless internet signal can be received and transmitted by a computer housed within the steel storage cabinet, one or more components for receiving and transmitting wireless signals into and out of the cabinet are provided. In one example, a high gain wireless antenna 800 may be mounted on an outside surface 801 of the cabinet with a panel SubMiniature version A ("SMA") coaxial RF connector 802, as shown in FIG. 8. A cable 804 from the SMA connector 802 is then routed to the computer 806 via a USB wireless adapter 808. This arrangement ensures that a wireless internet signal can reach a computer and/or other electronic equipment enclosed within a cabinet of the present invention. Such an arrangement may be provided on any of the embodiments shown in FIGS. 1-4. Other known means for receiving and transmitting wireless signals may also be used with the cabinet of the present invention.

Figure 9:
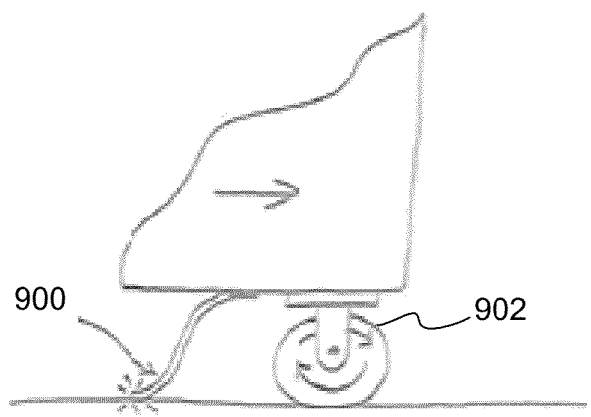
FIG. 9 depicts a grounding strap that may be used with the present invention.

The embodiments of the present invention may include castors, preferably made of plastic, to allow the cabinets to be moved from one location to another. This movement, however, may result in the accumulation of static electricity inside the cabinet, which may damage the components. To discharge any static electricity and thus protect the equipment housed within the cabinet, the present invention includes a grounding device 900, such as the grounding strap depicted in FIG. 9, mounted adjacent to the castors 902. Such a static strap is commercially available from NAPA Auto Parts. It should be understood that any suitable means for discharging the static electricity may be used additionally or alternatively to the grounding strap.

Figure 10:
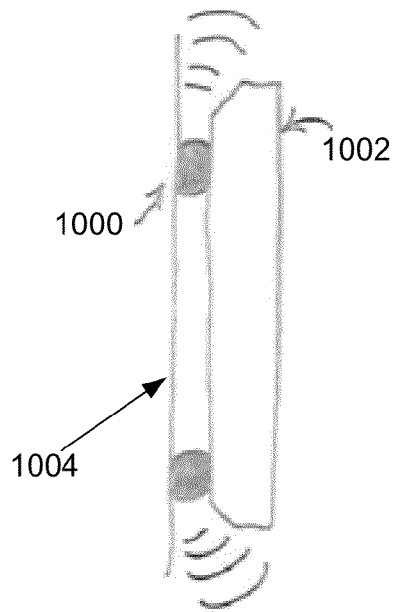
FIG. 10 depicts a shock absorbing device that may be used in the present invention.

The rolling movement of the cabinet from one location to another may also result in vibration, which may damage the sensitive electronic components. To absorb the shock of the vibration, the present invention provides a number of shock absorbing devices 1000 for the mounting of a large flat screen or touch screen 1002 to the wall 1004 of the storage cabinet, as depicted in FIG. 10. The shock absorbing devices may be made of rubber or steel, for example. Alternate shock absorbing arrangements may be used.

The cabinets described above allow electronic equipment to be housed at the construction site. Thus, contractors can access the BIM model from the construction site. When the equipment is not in use, the doors of the cabinets are closed and locked, thereby keeping the components safe from theft and from the elements. Further, the ventilation and cooling features of the present invention, along with the material of construction of the cabinet, provide protection for the stored equipment from temperature extremes of 0-60 degrees Celsius.

While the invention has been described in connection with certain embodiments, it will be understood that it is not intended to limit the invention to those particular embodiments. On the contrary, it is intended to cover all alternatives modifications, and equivalents included within the spirit and scope of the invention as defined by the appended claims.

The invention claimed is:

1. A storage cabinet comprising front, rear, and side walls extending upwardly from a bottom to define a storage space, the storage cabinet further comprising:
 a compartment located within the storage space configured to accommodate electronic equipment, the compartment including:
  a ventilation system for ventilating the compartment; and
  one or more components for receiving and transmitting wireless signals into and out of the cabinet;
 a grounding device mounted to the bottom of the cabinet configured to prevent accumulation of static electricity within the cabinet; and
 a shock absorbing device configured to mount the electronic equipment to the cabinet.

2. The storage cabinet of claim 1 wherein the compartment comprises two sections, each section configured to accommodate electronic equipment.

3. The storage cabinet of claim 1 further comprising an electronic cooling device for each piece of equipment.

4. The storage cabinet of claim 3 wherein the electronic cooling device is adapted to be mounted directly onto the electronic equipment.

5. The storage cabinet of claim 1 further comprising at least one shelving unit located within the storage space.

6. The storage cabinet of claim 1 wherein the electronic equipment comprises one or more of a touch screen, a television, a computer, a docking station, a printer, a keyboard and a mouse.

7. The storage cabinet of claim 1 further comprising one or more castors mounted to the bottom of the storage cabinet.

8. The storage cabinet of claim 1 wherein the one or more components for receiving and transmitting wireless signals comprise a high gain wireless antenna mounted on the outside of the storage cabinet with a SMA connector.

9. The storage cabinet of claim 8 wherein the one or more components for receiving and transmitting wireless signals further comprises a cable from the SMA connector routed to the computer.

10. The storage cabinet of claim 1 wherein the ventilation system comprises a cooling fan.

11. The storage cabinet of claim 1 wherein the ventilation system comprises a louvered vent.

12. A storage cabinet configured to accommodate electronic equipment, the storage cabinet comprising:
 a lower compartment and an upper compartment, each configured to accommodate the electronic equipment;
 a ventilation system for ventilating the cabinet;
 one or more components for receiving and transmitting wireless signals into and out of the cabinet;
 a grounding device mounted to the cabinet configured to prevent an accumulation of static electricity; and
 a shock absorbing device configured to mount the electronic equipment to the cabinet.

13. The storage cabinet of claim 12 wherein the lower compartment comprising at least one shelving unit.

14. The storage cabinet of claim 12 wherein the upper compartment includes an inclined surface upon which electronic equipment may be placed.

15. The storage cabinet of claim 14 wherein the upper compartment includes a wall surface upon which electronic equipment may be mounted.

16. The storage cabinet of claim 12 wherein the upper compartment comprises an enclosure for housing electronic equipment.

17. The storage cabinet of claim 12 wherein the electronic equipment comprises one or more of a touch screen, a television, a computer, a docking station, a printer, a keyboard and a mouse.

18. The storage cabinet of claim 12 further comprising one or more castors mounted to the storage cabinet.

19. The storage cabinet of claim 12 further comprising a cooling device for each piece of electronic equipment.

20. The storage cabinet of claim 19 wherein the cooling device comprises a thermoelectric cooler.

21. The storage cabinet of claim 12 wherein the ventilation system comprises a cooling fan.

22. The storage cabinet of claim 12 wherein the ventilation system comprises a louvered vent.

* * * * *